United States Patent
Wang et al.

(10) Patent No.: US 7,327,188 B2
(45) Date of Patent: Feb. 5, 2008

(54) POWER AMPLIFIER AND METHOD FOR ERROR CORRECTING OF OUTPUT SIGNALS THEREOF

(75) Inventors: Wen-Chi Wang, Yun-Lin Hsien (TW);
Fu-Yi Hsieh, Kao-Hsiung Hsien (TW);
Yi-Chang Tu, Tai-Nan (TW);
Chieh-Chuan Chin, Tai-Chung (TW)

(73) Assignee: Realtek Semiconductor Corp., HsinChu (TW)

( * ) Notice: Subject to any disclaimer, the term of this patent is extended or adjusted under 35 U.S.C. 154(b) by 187 days.

(21) Appl. No.: 11/306,904

(22) Filed: Jan. 16, 2006

(65) Prior Publication Data
US 2006/0197590 A1 Sep. 7, 2006

(30) Foreign Application Priority Data
Jan. 17, 2005 (TW) .............................. 94101321 A

(51) Int. Cl.
*H03F 3/38* (2006.01)
*H03K 7/08* (2006.01)

(52) U.S. Cl. ......................................... 330/10; 375/238

(58) Field of Classification Search ..................... None
See application file for complete search history.

(56) References Cited

U.S. PATENT DOCUMENTS

| 6,140,875 | A | 10/2000 | Van Den Homberg et al. |
| 6,768,779 | B1 | 7/2004 | Nielsen |
| 6,943,620 | B2 * | 9/2005 | Andersen et al. ............. 330/10 |
| 6,977,546 | B2 * | 12/2005 | Stapleton ...................... 330/10 |
| 7,058,464 | B2 * | 6/2006 | Mallinson .................... 700/94 |
| 7,248,193 | B2 * | 7/2007 | Fujimoto ..................... 341/143 |
| 2005/0012545 | A1 * | 1/2005 | Mallinson .................... 330/10 |

* cited by examiner

*Primary Examiner*—Robert Pascal
*Assistant Examiner*—Krista M Flanagan
(74) *Attorney, Agent, or Firm*—Winston Hsu

(57) ABSTRACT

An amplifier includes a subtracting unit for generating an error signal according to an input signal and an output signal; a noise shaping unit for executing a noise shaping operation on the error signal to produce a noise-shaped signal; a pulse adjustment unit for generating a control signal according to the noise-shaped signal and the input signal; and a power stage for generating the output signal according to the control signal.

20 Claims, 4 Drawing Sheets

POWER AMPLIFIER AND METHOD FOR ERROR CORRECTING OF OUTPUT SIGNALS THEREOF

BACKGROUND OF THE INVENTION

1. Field of the Invention

The present invention relates to a power amplifier, and more particularly, to a power amplifier and method for error correcting of the output signals thereof.

2. Description of the Prior Art

The class-D power amplifiers, due to their high efficiency, are being widely applied in various audio amplifying apparatus. However, the output signal quality from the class-D power amplifier is easily deteriorated by noise or by the imperfect nature of the switching power stage thereof.

U.S. Pat. No. 6,768,779 discloses a conventional power amplifier. This conventional power amplifier has a disadvantage that the central point of the waveform of the output signal outputted by this conventional power amplifier will be offset $t_0/2$.

In view of the foregoing, it can be appreciated that a substantial need exists for methods and apparatus to improve the quality and fidelity of signals output from the class-D amplifier.

SUMMARY OF THE INVENTION

It is therefore an objective of the claimed invention to provide a power amplifier and method for correcting error of output signals thereof.

An exemplary embodiment of a power amplifier is disclosed comprising a subtracting unit for generating an error signal according to an input signal and an output signal; a noise shaping module executing a noise shaping operation on the error signal to produce a noise-shaped signal; a pulse adjustment unit generating a control signal according to the noise-shaped signal and the input signal; and a power stage generating and adjusting the output signal according to the control signal.

An exemplary embodiment of a method for calibrating a power amplifier is disclosed comprising: generating an error signal according to an output signal from the power amplifier and an input signal; producing a noise-shaped signal by executing a noise shaping operation on the error signal; and generating a control signal according to the noise-shaped signal and the input signal to adjust the output signal.

An exemplary embodiment of a power amplifier is disclosed comprising: a first pulse width modulator for generating a pulse width modulated signal according to an input signal; a power stage generating an output signal according to a control signal; a subtracting unit generating an error signal according to the pulse width modulated signal and the output signal; a noise shaping module producing a noise-shaped signal according to the error signal; an adding unit summing the noise-shaped signal and the input signal to produce a calibration signal; and a second pulse width modulator generating the control signal according to the calibration signal; wherein the first and second pulse width modulation modulators are substantially the same.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
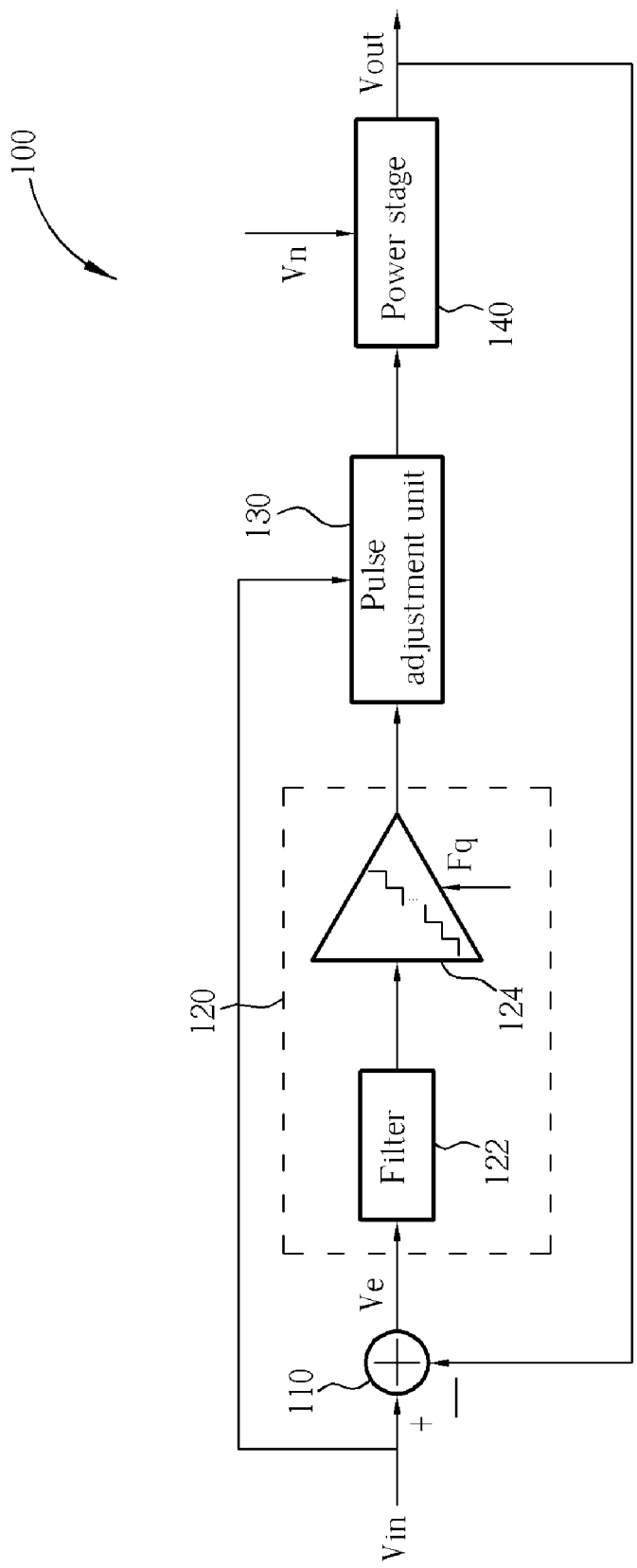
FIG. 1 is a functional block diagram of a power amplifier according to a first embodiment of the present invention.

Please refer to FIG. 1, which shows a functional block diagram of a power amplifier 100 according to a first embodiment of the present invention. As shown, the power amplifier 100 comprises a subtracting unit 110, a noise shaping module 120, a pulse adjustment unit 130, and a power stage 140, wherein the power stage 140 is a switching power stage. In an embodiment, the noise shaping module 120 can be implemented with a sigma-delta modulator.

In this embodiment, the class-D power amplifier 100 receives an input signal Vin, which is a digital audio signal such as a digital pulse width modulated (PWM) signal. The input signal Vin could be regarded as a DC signal for each pulse duration ($T_s=1/f_s$). Accordingly, the signal output error from the class-D power amplifier 100 can be corrected by compensating an error between the input and output signals of the class-D power amplifier 100 of $n^{th}$ pulse duration in $(n+1)^{th}$ pulse duration. In the following descriptions, operations of the class-D power amplifier 100 will be described as shown in FIG. 2.

Figure 2:
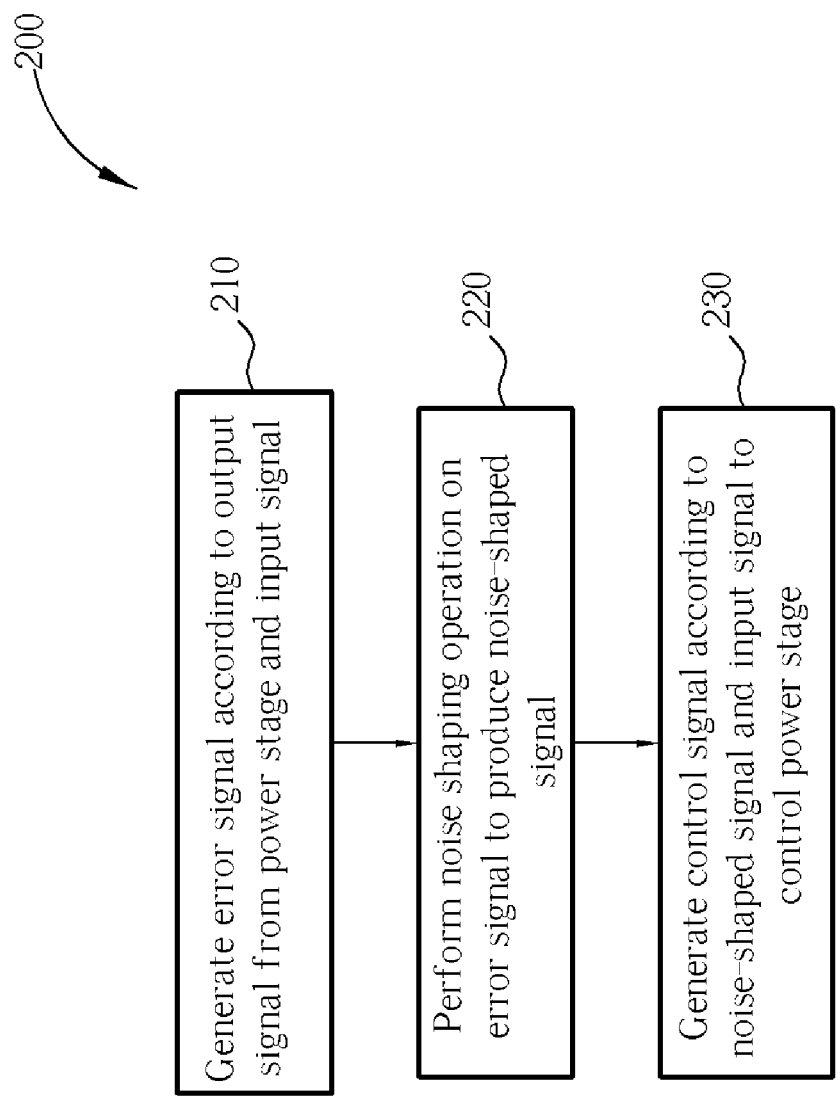
FIG. 2 is a flowchart illustrating a method for error correcting of signals from a power amplifier according to one embodiment of the present invention.

FIG. 2 shows a flowchart 200 illustrating a method for correcting signal error from the power amplifier 100 according to one embodiment of the present invention.

In step 210, the subtracting unit 110 subtracts an output signal Vout generated by the power stage 140 from the input signal Vin to produce an error signal Ve.

In step 220, the noise shaping module 120 performs a noise shaping operation on the error signal Ve to produce a noise-shaped signal. In the embodiment shown in FIG. 1, the noise shaping module 120 comprises a filter 122 and a m-bits quantizer 124. The filter 122 is arranged for filtering the error signal Ve to produce a filtered signal. The quantizer 124 is arranged for quantization of the filtered signal to produce the noise-shaped signal according to a working frequency $F_q$. In this embodiment, the working frequency $F_q$ of the quantizer 124 is equal to a frequency $f_s$ of the input signal Vin. In this embodiment, the noise energy of the error signal Ve is shifted to high frequency components by utilizing the noise shaping module 120 and thereby reduces the noise of low frequency components which may be perceived by human ears.

In step 230, the pulse adjustment unit 130 produces a control signal according to the noise-shaped signal and the input signal Vin to control the operations of the power stage 140. Specifically, the pulse adjustment unit 130 of this embodiment produces the control signal by adjusting the pulse width of the input signal Vin according to the noise-shaped signal so as to calibrate the error of the output signal Vout in next pulse duration.

In another embodiment, the working frequency $F_q$ of the quantizer 124 may be designed to be twice the frequency $f_s$ of the input signal Vin, i.e. $F_q=2f_s$, then the pulse adjustment unit 130 calibrates the error of the output signal Vout of former half pulse duration in the later half pulse duration. The error correction range is $\pm 2^{m-1} \cdot \Delta$, where m is the bit number of the quantizer 124 and Δ is the resolution of the pulse adjustment unit 130. In other words, by adjusting the working frequency of the quantizer 124, the timing of calibrating the error of the output signal from the class-D power amplifier 100 is changed.

Figure 3:
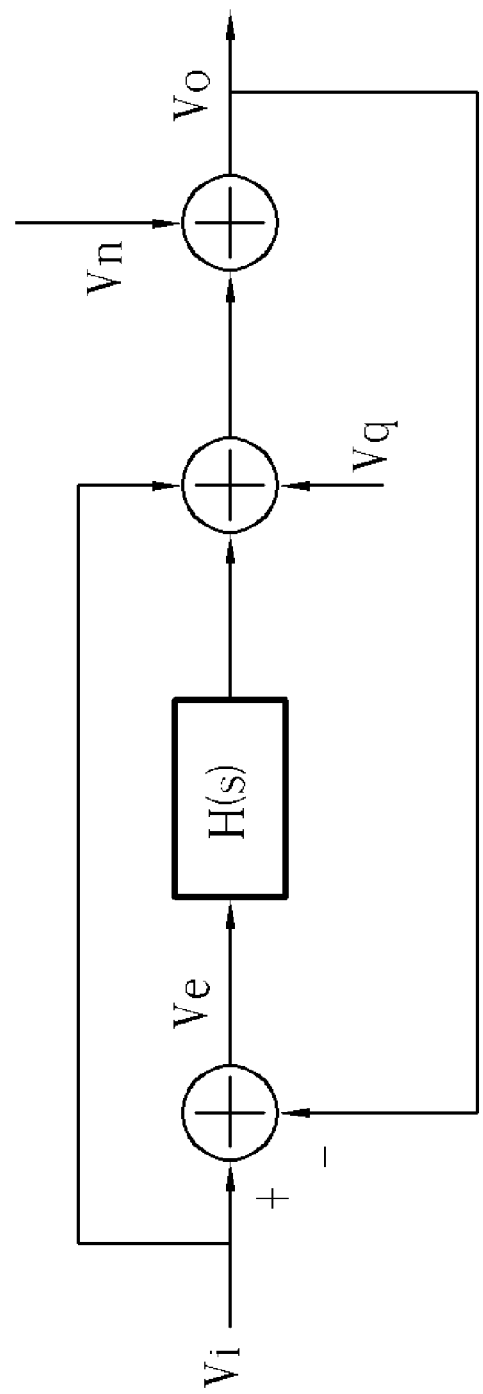
FIG. 3 is a linear model of the power amplifier of FIG. 1.

FIG. 3 depicts a linear model 300 of the power amplifier 100 of FIG. 1. In FIG. 3, Vn denotes the error from the power stage 140 caused by noise of power supply or the imperfect nature of the components thereof, Vq denotes the quantization error produced by the quantizer 124, and H(s) represents the transfer function of the filter 122. According to the linear model 300, the signal transform function (STF) and noise transform function (NTF) of the class-D power amplifier 100 can be expressed as follows:

$$STF = \frac{V_{out}}{V_{in}} = \frac{1+H(s)}{1+H(s)} \quad (1)$$

$$NTF = \frac{V_{out}}{V_n} + \frac{V_{out}}{V_q} = \frac{1}{1+H(s)} + \frac{1}{1+H(s)} \quad (2)$$

Form formulae (1) and (2), it can be derived that if the filter 122 is implemented with a low-pass filter, then the noise immunity of the class-D power amplifier 100 at the audio frequency (i.e., voice frequency) is significantly improved.

Figure 4:
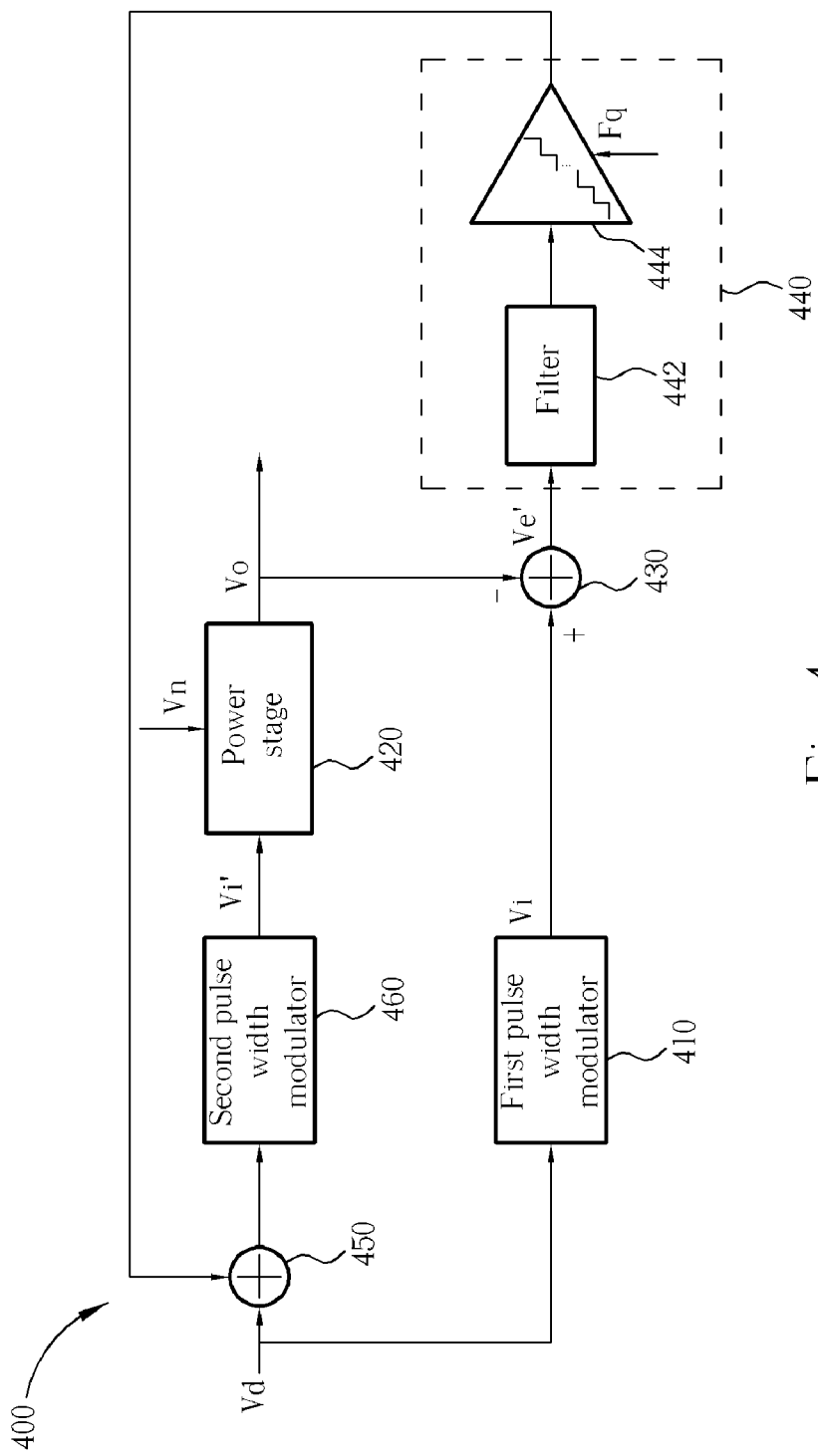
FIG. 4 is a functional block diagram of a power amplifier according to a second embodiment of the present invention.

FIG. 4 shows a functional block diagram of a class-D power amplifier 400 according to a second embodiment of the present invention. As shown in FIG. 4, the class-D power amplifier 400 comprises a first pulse width modulator 410 for generating a PWM signal Vi according to an input signal Vd; a power stage 420 for generating an output signal Vo according to a control signal Vi'; a subtracting unit 430 for producing an error signal Ve' according to the PWM signal Vi and the output signal Vo; a noise shaping module 440 for producing a noise-shaped signal according to the error signal Ve'; an adding unit 450 for summing the noise-shaped signal and the input signal Vd to produce a calibration signal; and a second pulse width modulator 460 for generating a control signal Vi' utilized in the power stage 420 according to the calibration signal. The first and second pulse width modulators 410 and 460 are substantially the same. Therefore, if the feedback path constituted by the subtracting unit 430 and the noise shaping module 440 is ignored, the PWM signal Vi output from the first pulse width modulator 410 and the control signal Vi' output from the second pulse width modulator 460 are identical. In practice, each of the first and second pulse width modulators 410 and 460 may be implemented with a counter.

In this embodiment, the noise shaping module 440 comprises a filter 442 and a m-bits quantizer 444. The functions and operations of the filter 442 and the quantizer 444 are substantially the same as the filter 122 and the quantizer 124, respectively, and further details are therefore omitted. Additionally, in the class-D power amplifier 400, the cooperation of the adding unit 450 and the second pulse width modulator 460 realizes the functions of the pulse adjustment unit 130 of the first embodiment. In this embodiment, the error correction range is $\pm 2^{m-1} \cdot \Delta$, $\Delta = T_s/2^n$, where m is the bit number of the quantizer 444 and n is the bit number of the second pulse width modulator 460. Similarly, by utilizing the feedback control, the error from the power stage 420 caused by the noise of the power supply or the imperfect nature of the components thereof and the quantization error of the quantizer 444 are all significantly improved.

As disclosed in the foregoing descriptions, the error calibration method for the class-D power amplifier in the present invention is capable of accurately controlling the error correction range while also avoiding the error correction range from being affected by the process variation of the components thereof so that the undesirable output saturation problems are thereby improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power amplifier comprising:
   a subtracting unit generating an error signal according to an input signal and an output signal;
   a noise shaping module, coupled to the subtracting unit, performing a noise shaping operation on the error signal to produce a noise-shaped signal;
   a pulse adjustment unit, coupled to the noise shaping module, generating a control signal according to the noise-shaped signal and the input signal; and
   a power stage, coupled to the pulse adjustment unit, adjusting the output signal according to the control signal.

2. The power amplifier of claim 1, wherein the power stage is a switching power stage.

3. The power amplifier of claim 1, wherein the noise shaping module comprises:
   a filter filtering the error signal to produce a filtered signal; and
   a quantizer, coupled to the filter, quantizing the filtered signal to produce the noise-shaped signal.

4. The power amplifier of claim 3, wherein the filter is a low-pass filter.

5. The power amplifier of claim 1, wherein the pulse adjustment unit adjusts a pulse width of the input signal according to the noise-shaped signal to produce the control signal.

6. The power amplifier of claim 5, wherein the input signal is a pulse width modulated (PWM) signal.

7. The power amplifier of claim 5, wherein the noise shaping module comprises:
   a filter filtering the error signal to produce a filtered signal; and
   a quantizer, coupled to the filter, quantizing the filtered signal to produce the noise-shaped signal.

8. The power amplifier of claim 7, wherein a working frequency of the quantizer is twice a frequency of the input signal.

9. The power amplifier of claim 7, wherein the noise shaping module is a sigma-delta modulator.

10. The power amplifier of claim 1, wherein the noise shaping module is a sigma-delta modulator.

11. The power amplifier of claim 1, wherein a working frequency of the noise shaping module is twice a frequency of the input signal.

12. The power amplifier of claim 1, wherein a working frequency of the noise shaping module is higher than a frequency of the input signal.

13. The power amplifier of claim 1 is a class-D power amplifier.

14. A method for calibrating a power amplifier comprising:
   generating an error signal according to an output signal from the power amplifier and an input signal;

producing a noise-shaped signal by performing a noise-shaping operation on the error signal; and generating a control signal according to the noise-shaped signal and the input signal to adjust the output signal.

15. The method of claim 14, wherein the step of producing the noise-shaped signal comprises:

filtering the error signal to produce a filtered signal; and quantizing the filtered signal to produce the noise-shaped signal.

16. The method of claim 14, wherein the step of generating the control signal comprises:

adjusting a pulse width of the input signal according to the noise-shaped signal to produce the control signal.

17. The method of claim 14, wherein the step of generating the control signal comprises:

summing the noise-shaped signal and the input signal to produce a calibration signal; and adjusting a pulse width of the calibration signal to produce the control signal.

18. The method of claim 14, wherein the input signal is a pulse width modulated signal.

19. A power amplifier comprising:

a first pulse width modulator for generating a pulse width modulated signal according to an input signal;

a power stage for generating an output signal according to a control signal;

a subtracting unit, coupled to the first pulse width modulator and the power stage, generating an error signal according to the pulse width modulated signal and the output signal;

a noise shaping module, coupled to the subtracting unit, producing a noise-shaped signal according to the error signal;

an adding unit, coupled to the input signal and the noise shaping module, summing the noise-shaped signal and the input signal to produce a calibration signal; and a second pulse width modulator, coupled to the adding unit and the power stage, generating the control signal according to the calibration signal;

wherein the first and second pulse width modulators are substantially the same.

20. The power amplifier of claim 19, wherein the noise shaping module comprises:

a filter filtering the error signal to produce a filtered signal; and a quantizer, coupled to the filter, quantizing the filtered signal to produce the noise-shaped signal.

* * * * *